(12) United States Patent
McNamara et al.

(10) Patent No.: US 6,195,757 B1
(45) Date of Patent: Feb. 27, 2001

(54) METHOD FOR SUPPORTING 1½ CYCLE DATA PATHS VIA PLL BASED CLOCK SYSTEM

(75) Inventors: Timothy Gerard McNamara, Fishkill; Patrick James Meaney, Poughkeepsie; Paul David Muench, Poughkeepsie; Giacomo Vincent Ingenio, Poughkeepsie, all of NY (US)

(73) Assignee: International Business Machine Corporation, Armonk, NY (US)

( * ) Notice: Subject to any disclaimer, the term of this patent is extended or adjusted under 35 U.S.C. 154(b) by 0 days.

(21) Appl. No.: 09/013,637

(22) Filed: Jan. 26, 1998

(51) Int. Cl.[7] .................................................... G06F 13/00
(52) U.S. Cl. ........................................ 713/400; 710/125
(58) Field of Search ................................. 713/400–601; 710/125

(56) References Cited

U.S. PATENT DOCUMENTS

| | | | |
|---|---|---|---|
| 4,607,348 | * | 8/1986 | Sheth . |
| 5,790,614 | * | 8/1998 | Powell ................................. 375/376 |
| 5,859,986 | * | 1/1999 | Marenin ............................... 713/401 |
| 5,930,523 | * | 7/1999 | Kawasaki et al. ..................... 712/32 |

* cited by examiner

Primary Examiner—David A. Wiley
(74) Attorney, Agent, or Firm—Lynn L. Augspurger

(57) ABSTRACT

A system for improving system cycle time while supporting 1½ cycle data paths with a PLL based clock system using a communication circuit providing a first mode of operation whereby a first cycle time is obtained, and for allowing use of a second mode of operation whereby a second longer multi-mode cycle time is obtained to extend the time for evaluation of data on the bi-directional data path between a first chip and a memory circuit.

4 Claims, 2 Drawing Sheets

METHOD FOR SUPPORTING 1½ CYCLE DATA PATHS VIA PLL BASED CLOCK SYSTEM

FIELD OF THE INVENTION

This invention is related to chip technology for computers and like processing systems, and particularly to a system for improving system cycle time while supporting 1½ cycle data paths with a PLL based clock system.

BACKGROUND OF THE INVENTION

Advances in system chip technology and integration has allowed chips to operate at increasingly higher frequencies. For many systems we find that some of the most critical paths in the system are not on-chip, but between chips. For example the next generation of IBM systems being designed could operate at faster than 4.7 ns. per cycle; but, with the current design for the next generation of chips having physical locations of a multi-chip module (MCM) and memory cards on the same board a delay across the longest nets from say the MCM to a memory card takes a minimum of 5.3 ns. This means that the system can not work at a 5.0 ns cycle time unless other methods are found. Therefore, there is a need to improve on the methods for increasing and maintaining the desired high frequencies of intrachip communication in these future systems, and yet until this invention, the prior attempts fell short.

SUMMARY OF THE INVENTION

We have provided a system enabled by use of our new system communication circuit for providing a first mode of operation whereby a first cycle time is obtained, and for allowing use of a second mode of operation whereby a second longer multi-mode cycle time is obtained to extend the time for evaluation of data on the bi-directional data path between a multi-chip module and a memory circuit.

The improvements which we have made achieve greatly improved cycle time, as well as a wider range of cycle times which is especially advantageous during machine (a computer or like system processor) bringup and system debug. We have found that our method is much easier to implement than other techniques we have tried, and in addition, our method is independent of the chip process parameters.

These and other improvements are set forth in the following detailed description. For a better understanding of the invention with advantages and features, refer to the description and to the drawings.

BRIEF DESCRIPTION OF THE DRAWINGS

FIG. 1 shows schematically an overview of the preferred embodiment of our system communication circuit, illustrated by FIGS. 1A and 1B.

FIG. 2A shows the interface timing across the communication network of the multi-cycle mode of both FIG. 1A and FIG. 1B, while

Figure 1A:
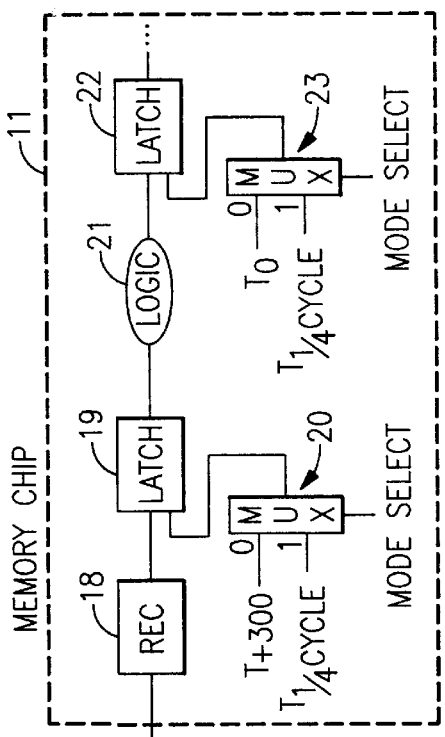
FIG. 1A shows the circuit design required when the MCM chip 10 drives data/control signals to the MEMORY chip 11 and FIG. 1B shows the circuit design required when the MEMORY chip 11 drives data/control signals to the MCM chip 10.
Figure 1A:
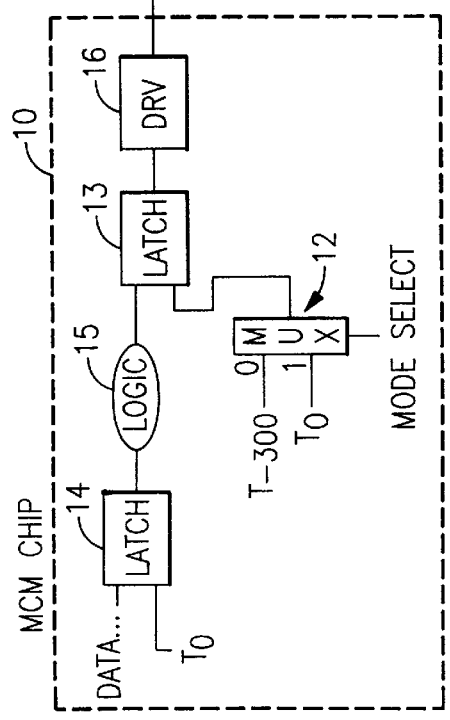

DETAILED DESCRIPTION OF THE INVENTION:

Before considering our preferred embodiments in detail, it may be worthwhile to illustrate, by way of example, to illustrate some of the problems which may not be readily apparent to those of ordinary skill in this art. For instance, one common method which has been used in other situations to improve frequencies is know as cycle stealing. In cycle stealing, the chip that launches out the data/control signal, will launch out its signal earlier than normal and/or the chip that captures the data/control signal will capture this data later than normal. This is accomplished by designing the clock system to allow early and late clocks. The problem with this design which may not have been noticed is that one can steal only so much from the paths preceding an early clock and from paths following a late clock. For the next generation machine such as an IBM* S/390* (both trademarks of International Business Machines Corporation, Armonk, N.Y., the assignee hereunder) successor to the models grouped under what was known as the "H" series which could utilize our invention, we would estimate that only 600 ps can be stolen from the two paths that surround the off-chip board net. Hence, the best cycle time the machine will ever run at would be approximately 4.7 ns (5.3 ns–0.600 ns)! This will not meet the design objective which would be desirable in a next generation of IBM systems being designed which could operate at, say, 5.0 ns.

If one designed something which on the average, like this cycle stealing example, one could perhaps improve the result in an expensive way by sorting chips so that the average of the chips used might reach for our goal and run faster than 4.7 ns, but the package would limit how fast the machine could run. To avoid having the package being the limit to a faster machine cycle time, the paths between the memory cards and the MCM can be run at a 1.5 cycle rate. (Note that some prior IBM machines of the H series used 2.5 cycle paths between boards.)

There are three major problems with this method:

(1) When using 1.5 cycle paths, the minimum delay a path must be is now ½ the cycle time to avoid early mode problems. For the next generation machine, there are hundreds of paths that would have to have additional delay added to them to ensure that there is no early mode exposure. This delay would be added by either increasing the board/MCM wire on these nets or by adding silicon delay. Both of these solutions are not practical. The board can not handle all the forced wire and the delay tolerance of the silicon circuits can be from 30% to 50%.

(2) Even if delays could be added to these nets, the cycle time range that the machine could operated would be extremely limited. As you decrease the cycle time the long path gets stressed by a factor of 1.5× the cycle time. As you increase the cycle time the early paths get stressed by a factor of ½ the cycle time. Given the hundreds of nets on this interface and their range of delays, the valid cycle time range that the machine would work at is extremely small and not practical for a machine bringup and debug. For IBM's H series machines communication between boards were via cables Since these were 2.5 cycle paths, new sets of cables had to be changed when the machine cycle time was changed. This made bringup very difficult.

(3) This method would be inordinately expensive due to waste.

Figure 1B:
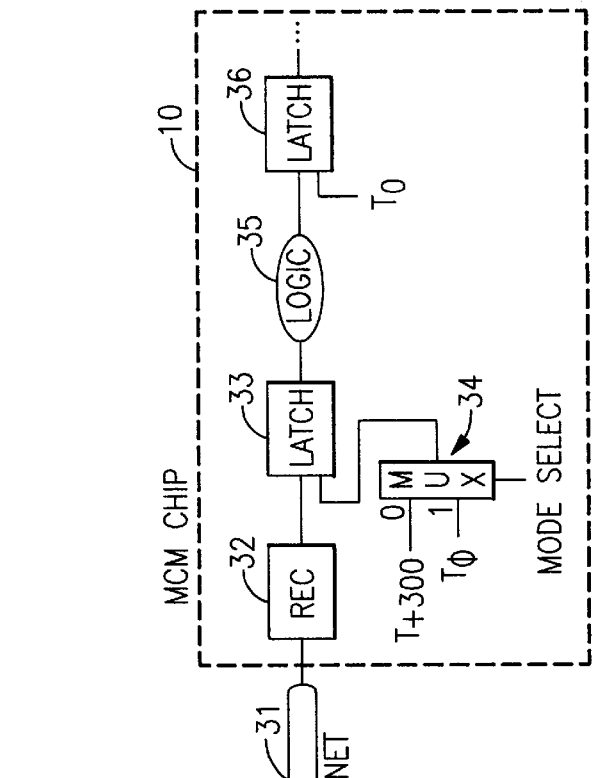
Figure 1B:
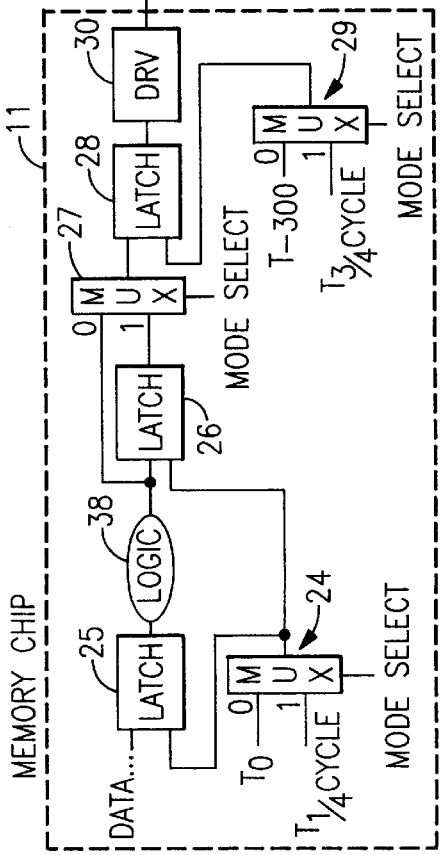

Turning now to our preferred embodiment illustrated in FIGS. 1A and 1B of our communication circuit for exchanging data between a multi-chip module and a memory chip which supports two modes of operation.

Turning our attention to FIG. 1A, we provide data in to the MCM chip Data in Latch 14 and this is processed under timing control of a multiplexor MUX 12 which has a control signal called "mode select" provided by system controls.

When mode select is a 0 this first input control signal to a first input port of multiplexor MUX12 labeled T-300 will be sent to the output of MUX 12, while when the mode select is a 1 this second input control signal of the multiplexor MUX 12 is the signal labeled TO which is sent to the output of MUX 12. The output of MUX 12 is coupled to a clock input of MCM data out LATCH 13 and drives the clock of LATCH 13. The data input of data out LATCH 13 comes from data in LATCH 14 after passing through some combinatorial logic 15. LATCH 14 is clocked by the signal labeled T0. The output of LATCH 13 drives a chip communication interface driver DRV 16, which in turns drives data to the communication network NET 17.

Now the MCM chip is coupled by the forgoing circuit to the MEMORY chip on the board, and this board has MEMORY chip 11 which includes a receiver circuit REC 18 responsive to the communication driver 16 to which it is coupled by the communication network NET 17. The receiver circuit REC 18 in turn drives the data input of a first memory chip data in LATCH 19. The clock input of the first memory chip LATCH 19 is driven from the output of a memory chip multiplexor MUX 20. The memory chip MUX 20 will receive the T+300 signal at a MUX 20 input labeled T+300 if mode select is a 0 or the T+¼ cycle signal at T+¼ cycle input when the mode select is a 1. The output of memory chip data in LATCH 19 drives memory chip combinatorial logic 21, which in turn drives the data input of a second memory chip LATCH 22 which continues on to the chip logic. The clock input of LATCH 22 is driven by a third multiplexor of said memory chip MUX 23. The output of MUX 23 will receive T0 if mode select is a 0 or T+¼ cycle is mode select is a 1.1 n this manner the MCM chip drives the data/control signals to the MEMORY chip 11. Thus, when the MCM chip drives data to LATCH 22 of MEMORY chip 11 the data is transferred on to the core of the MEMORY chip.

Now when the memory needs to provide data/control signals to the MCM chip 10, as shown now in FIG. 1B, the MEMORY chip 11 drives the MCM chip 10. For this purpose The output of a first memory chip multiplexor MUX 24 drives the clock inputs of memory chip data receiving LATCH 25 and memory chip new multimode time LATCH 26. The output of this first memory chip multiplexor MUX 24 will output the TO signal to LATCH 26 clock input if mode select is a 0 or T+¼ cycle is mode select is a 1. MUX 24 is coupled to a memory chip LATCH's 25 clock input as well as to the clock input of memory chip LATCH 26. The output of a second memory chip multiplexor MUX 27 will receive the output of LATCH 25 after it has gone through combinatorial logic 28 when mode select is a 0 or the output of LATCH 26 when mode select is a 1. The output of the second memory chip multiplexor MUX 27 drives the data input of output LATCH 28. The output of a third memory chip multiplexor MUX 29 will receive T−300 if mode select is a 0 or T+¾ cycle if mode select is a 1. The output of MUX 29 drives the clock input of LATCH 28. The output of LATCH 28 drives a network driver circuit DRV 30, whick in turns drives data via the communication network NET 31 over to MCM chip 10. The input of MCM chip receiver REC 32 is obtained via NET 31 and the output of REC 32 drives the input of the MCM interface receiving latch LATCH 33. The clock input of LATCH 33 is the output of the MCM chip multiplexor MUX 34. The output of multiplexor MUX 34 is T−300 when mode select is a 0 or T0 when mode select is a 1. The output of LATCH 33 drives combinatorial logic 35, which in turn drives the data input of LATCH 36. The clock input of LATCH 36 is driven by the T0 clock signal.

In approaching the need to improve on the methods for increasing and maintaining the desired high frequencies of intrachip communication in these future systems, we can with the described preferred embodiment take advantage of our PLL (phased lock loop)-based clock distribution and generation structure that we can be used in the next generation machine. The next generation clock system will support cycle stealing the memory interface and if the machine cycle time does get faster than cycle stealing can support, the clock system will support a new and improved form of 1.5 cycle paths.

Thus our preferred embodiment provides a PLL to drive one or more phases of the clock. The clock distribution system will provide that the I/O latches on the memory interface can be programmed to receive any one of these clock phases. For example, if the PLL generates a clock that is delayed by ¼ of the cycle, we can use this clock to launch out the data late by ¼ of the cycle. Hence when the cycle time changes, the late mode paths are affected by 1.25 times the cycle while the early mode paths are affected by 0.25 times the cycle. In other words, since the clock that launches out the data is a function of cycle time, it tracks with any cycle time change. This property, along with the fact that the PLL generates a phase shift with extremely good accuracy (its tolerance is independent of the cycle time), allows the machine to operate over a much larger cycle time range as well as a faster cycle time range than a "standard" 1.5 cycle method.

In developing our preferred structure we avoid a fixed delay either in wire or silicon to generate the ¼ cycle delay as might be used in a "standard" solution. There is a disadvantage to such as delay which requires delays to be changed when the cycle time changes and because of tolerances with these delays, the valid cycle time range is smaller and the fastest cycle time is larger than our method. As an example we have taken the current delay values of memory interface for the next generation machine and using silicon tolerances of 30% and wire tolerances of 5% we compared the valid cycle time ranges and the fastest cycle time. For our method the valid cycle time range is 4.2 ns to 5.6 ns versus 4.5 ns to 5.5 ns if adding wire delay of 1.4 ns and 4.7 ns to 4.8 ns if we added silicon delay of 1.4 ns. Thus our range is greater and the fastest cycle time is achieved with our system.

Thus, in implementing our invention as shown in the FIGURES, we provided a circuit that supports two modes of operation that guarantee successful data transfers between MCM and MEMORY chips over a range of cycle times. These cycle time ranges are faster than the delay of the net and circuitry between the sending and receiving latches on the MCM and MEMORY chip. The first mode of operation involves using late and early clocks to "steal" time from on chip paths and give that time to the off chip path. Again referring to FIG. 1A, which shows the MCM chip sending data to the MEMORY chip, cycle stealing mode will occur when the mode select signal is set to a 0. In this mode, when MCM chip 10 drives data to MEMORY chip 11, the driving LATCH 13 will get T−300 ps clocks and the receiving LATCH 19 will get T+300 ps clocks. The logic path path between LATCH 14 and LATCH 13 on MCM chip 10 will have 300 ps less time due to the T−300 ps clock that LATCH 13 receives. Likewise that logic path between LATCH 19 and LATCH 22 will have 300 ps less time due to the T+300 clock that LATHC 19 receives. However the path between LATCH 13 and LATCH 19 will have an additional 600 ps of time, because 300 ps was "stolen" from the path before LATCH 13 and the path after LATCH 19 and given to the path between LATCH 13 and LATCH 19. Hence if the delay between LATCH 13 and LATCH 19 was 5.3 ns and the delay between LATCH 14 to LATCH 13 and LATCH 19 to LATCH 22 was 4.4 ns or less, the cycle time that the machine could run at would be 4.7 ns. If a faster cycle time was required, the multicycle mode would be used and this will now be described.

To switch from cycle stealing mode to multicycle mode, the mode select signal is set to a 1. Again referring to FIG. 1A, when mode select is set to a 1, LATCH 13 now gets a T0 clock from MUX 12 and all the latches on MEMORY chip 11 get a T+¼ cycle clock. The path between LATCH 14 and LATCH 13 on MCM chip 10 now has a full cycle time to evaluate, whereas in the cycle stealing case, that path had 300 ps less time. The same is true for the path between LATCH 19 and LATCH 22 on MEMORY chip 11. The path between LATCH 13 and LATCH 19 now has 1 and ¼ cycle to evaluate. Since all these paths now have more time to evaluate, the cycle time of the machine can be reduced even further.

The same situation occurs as illustrated by FIG. 1B when MEMORY chip 11 sends data to MCM chip 10 with a small exception when the multicycle mode is used. When mode select is set to a 1, LATCH 26 gets a T+¼ cycle clock while LATCH 28 gets T+¾ cycle clock. This half cycle transfer between LATCH 26 and LATCH 28 is needed to get the interface path between LATCH 28 and LATCH 33 on a 1 and ¼ cycle boundary. Once again in multicycle mode, the long paths on chip as well as the interface is improved so the cycle time can be reduced.

Figure 2A:
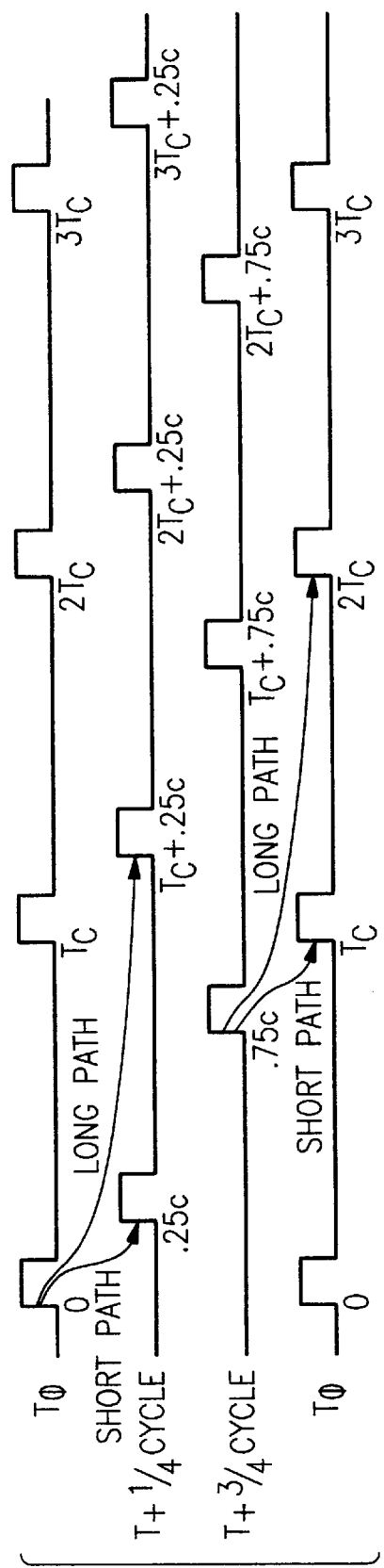
Figure 2B:
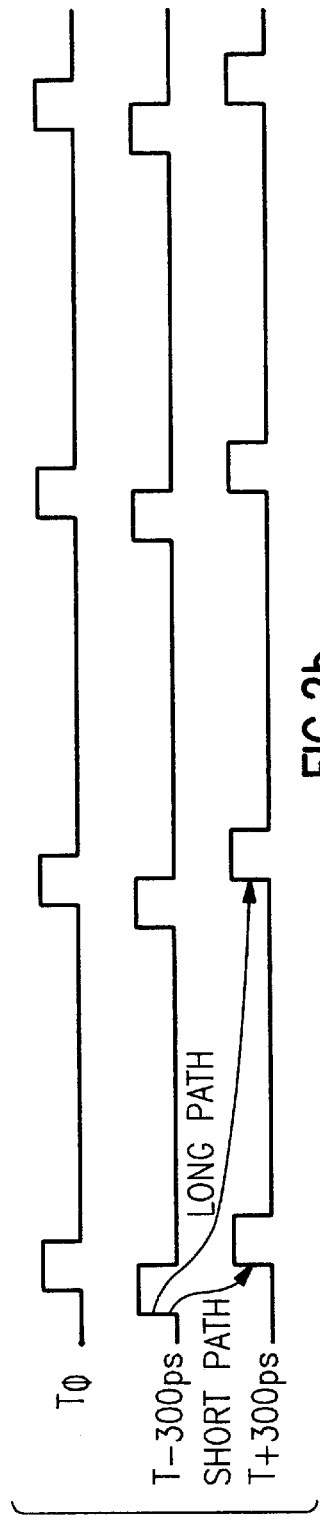
FIG. 2B shows the interface timing across the communication network for the cycle stealing mode of both FIG. 1A and FIG. 1B.

In order to summarize the effect of switching between the multicycle mode and the cycle stealing mode, we have illustrated in FIG. 2A the interface timing across the communication network of the multi-cycle mode of both FIG. 1A and FIG. 1B, and in FIG. 2B the interface timing across the communication network for the cycle stealing mode of both FIG. 1A and FIG. 1B.

While we have described our preferred embodiments of our invention, it will be understood that those skilled in the art, both now and in the future, may make make various improvements and enhancements which fall within the scope of the claims which follow. These claims should be construed to maintain the proper protection for the invention first disclosed.

What is claimed is:

1. A system for improving data paths between a first chip and a second chip with a phased lock look based clock system, wherein said system comprises, a communication circuit for exchanging data between a first chip and a second chip which supports two modes of operation for data transfer therebetween over a range of cycle times which range faster than any delay of a communication network and interface between sending and receiving latches on said first chip and second chip, including a first mode circuit responsive to a first mode select signal for preparing data in said first chip to be sent over said communication network to said second chip enabling the use of late and early clocks to steal time from on-chip paths of said first chip and to give that time to the off first chip path of said exchanging data by a cycle stealing mode occurring when said first mode select signal controls circuit cycle time such that said first chip drives data to said second chip at a first frequency in which mode cycle stealing derives cycles from said first chip and provides them to said second chip, and wherein is provided, a second mode circuit responsive to a second mode select signal for preparing data in said first chip to be sent over said communication network to said second chip enabling a switch from a cycle stealing mode to multi-cycle mode which provides a more than a full cycle time for evaluation of data being exchanged.

2. A system according to claim 1 wherein is provided,
   for said communication circuit a second chip to first chip circuit for use when the second chip drives data/control signals to said first chip, said second chip to first chip circuit being responsive when said multicycle mode is in effect to add cycle time to the data paths of said second chip to extend the interface path between said second chip and said first chip in the multicycle mode.

3. A system according to claim 1 wherein is provided, for said first chip a circuit which can have its on chip cycle time improved and its cycle time improved on the same path by switching to a multi-cycle mode.

4. A system according to claim 1 wherein less restrictive early mode padding is obtained by using multi-phase clocks applied to input/output latches of the said communication circuit.

* * * * *

UNITED STATES PATENT AND TRADEMARK OFFICE
CERTIFICATE OF CORRECTION

PATENT NO. : 6,195,757 B1
DATED : February 27, 2001
INVENTOR(S) : McNamara et al.

It is certified that error appears in the above-identified patent and that said Letters Patent is hereby corrected as shown below:

Column 3,
Line 32, "a 1.1 n" should be -- 1. In --;
Line 57, "whick" should be -- which --;

Column 4,
Line 64, "path path" delete "path" second occurrence;

Column 5,
Line 2, "LATHC" should be -- LATCH --;
Line 45, "make make" delete "make" second occurrence;

Signed and Sealed this

Nineteenth Day of March, 2002

Attest:

*Attesting Officer*

JAMES E. ROGAN
*Director of the United States Patent and Trademark Office*